(12) United States Patent
Reed et al.

(10) Patent No.: US 8,772,058 B2
(45) Date of Patent: Jul. 8, 2014

(54) METHOD FOR MAKING A REDISTRIBUTED WAFER USING TRANSFERRABLE REDISTRIBUTION LAYERS

(75) Inventors: Thomas Reed, Melbourne, FL (US); David Herndon, Palm Bay, FL (US); Suzanne Dunphy, Indialantic, FL (US)

(73) Assignee: Harris Corporation, Melbourne, FL (US)

( * ) Notice: Subject to any disclaimer, the term of this patent is extended or adjusted under 35 U.S.C. 154(b) by 60 days.

(21) Appl. No.: 13/364,858

(22) Filed: Feb. 2, 2012

(65) Prior Publication Data

US 2013/0203190 A1 Aug. 8, 2013

(51) Int. Cl.
*G01R 31/26* (2014.01)
*H01L 21/66* (2006.01)

(52) U.S. Cl.
USPC ................................................. 438/17; 438/15

(58) Field of Classification Search
USPC ............................................. 438/15, 17
See application file for complete search history.

(56) References Cited

U.S. PATENT DOCUMENTS

| | | | | |
|---|---|---|---|---|
| 3,333,326 A | * | 8/1967 | Thomas, Jr. et al. | 438/10 |
| 3,726,002 A | * | 4/1973 | Greenstein et al. | 29/832 |
| 5,034,091 A | * | 7/1991 | Trask et al. | 216/18 |
| 5,192,716 A | * | 3/1993 | Jacobs | 29/832 |
| 5,311,404 A | * | 5/1994 | Trask et al. | 361/762 |
| 5,514,613 A | * | 5/1996 | Santadrea et al. | 438/15 |
| 5,521,122 A | * | 5/1996 | Kuramochi | 29/832 |
| 5,691,245 A | * | 11/1997 | Bakhit et al. | 216/20 |
| 5,998,291 A | * | 12/1999 | Bakhit et al. | 438/618 |
| 6,222,212 B1 | * | 4/2001 | Lee et al. | 257/207 |
| 6,514,780 B2 | * | 2/2003 | Manyoki | 438/18 |
| 6,746,898 B2 | * | 6/2004 | Lin et al. | 438/113 |
| 6,762,074 B1 | | 7/2004 | Draney et al. | |
| 6,875,638 B2 | * | 4/2005 | Yoneda et al. | 438/125 |
| 6,995,044 B2 | * | 2/2006 | Yoneda et al. | 438/125 |
| 7,208,335 B2 | | 4/2007 | Boon et al. | 438/33 |
| 7,425,458 B2 | * | 9/2008 | Seshan | 438/17 |
| 7,435,910 B2 | * | 10/2008 | Sakamoto et al. | 174/260 |
| 7,728,437 B2 | | 6/2010 | Choi et al. | 257/774 |
| 7,749,814 B2 | | 7/2010 | Lin et al. | 438/125 |
| 7,807,505 B2 | * | 10/2010 | Farnworth et al. | 438/113 |
| 2003/0122244 A1 | * | 7/2003 | Lin et al. | 257/700 |
| 2003/0122246 A1 | * | 7/2003 | Lin et al. | 257/723 |
| 2003/0124767 A1 | * | 7/2003 | Lee et al. | 438/107 |
| 2005/0233482 A1 | * | 10/2005 | Kirby et al. | 438/15 |
| 2007/0262436 A1 | * | 11/2007 | Kweon et al. | 257/686 |

(Continued)

FOREIGN PATENT DOCUMENTS

WO 9009093 8/1990
WO 2004051737 6/2004

*Primary Examiner* — Yu-Hsi D Sun
*Assistant Examiner* — Grant Withers
(74) *Attorney, Agent, or Firm* — Allen, Dyer, Doppelt, Milbrath & Gilchrist, P.A.

(57) ABSTRACT

A method of making redistributed electronic devices that includes providing a wafer having a plurality of electronic devices, each electronic device having a pattern of contact areas forming die pads. The method also includes forming redistribution layers on a temporary substrate having a pattern of contact areas forming wafer bonding pads matching the die pads and a pattern of contact areas forming redistributed pads different than the wafer bonding pads, the wafer bonding pads are coupled to the redistributed pads through a plurality of stacked conductive and insulating layers. The die pads are coupled to the wafer bonding pads, and the temporary substrate is removed. The wafer and redistribution layers are then divided into a plurality of redistributed electronic devices.

24 Claims, 8 Drawing Sheets

(56) References Cited

U.S. PATENT DOCUMENTS

| | | | |
|---|---|---|---|
| 2008/0132006 A1* | 6/2008 | Jiang et al. | 438/123 |
| 2008/0265367 A1* | 10/2008 | Tan et al. | 257/531 |
| 2008/0315372 A1* | 12/2008 | Kuan et al. | 257/659 |
| 2010/0068837 A1* | 3/2010 | Kumar et al. | 438/17 |
| 2011/0074028 A1* | 3/2011 | Pendse | 257/737 |
| 2012/0015532 A1* | 1/2012 | Markovich et al. | 439/78 |
| 2012/0098129 A1 | 4/2012 | Reed et al. | |
| 2012/0146216 A1* | 6/2012 | Kang et al. | 257/737 |
| 2012/0187545 A1* | 7/2012 | Khan et al. | 257/621 |
| 2012/0306068 A1* | 12/2012 | Saito | 257/734 |
| 2013/0056880 A1* | 3/2013 | Wang et al. | 257/777 |
| 2013/0203240 A1* | 8/2013 | Reed et al. | 438/464 |

* cited by examiner

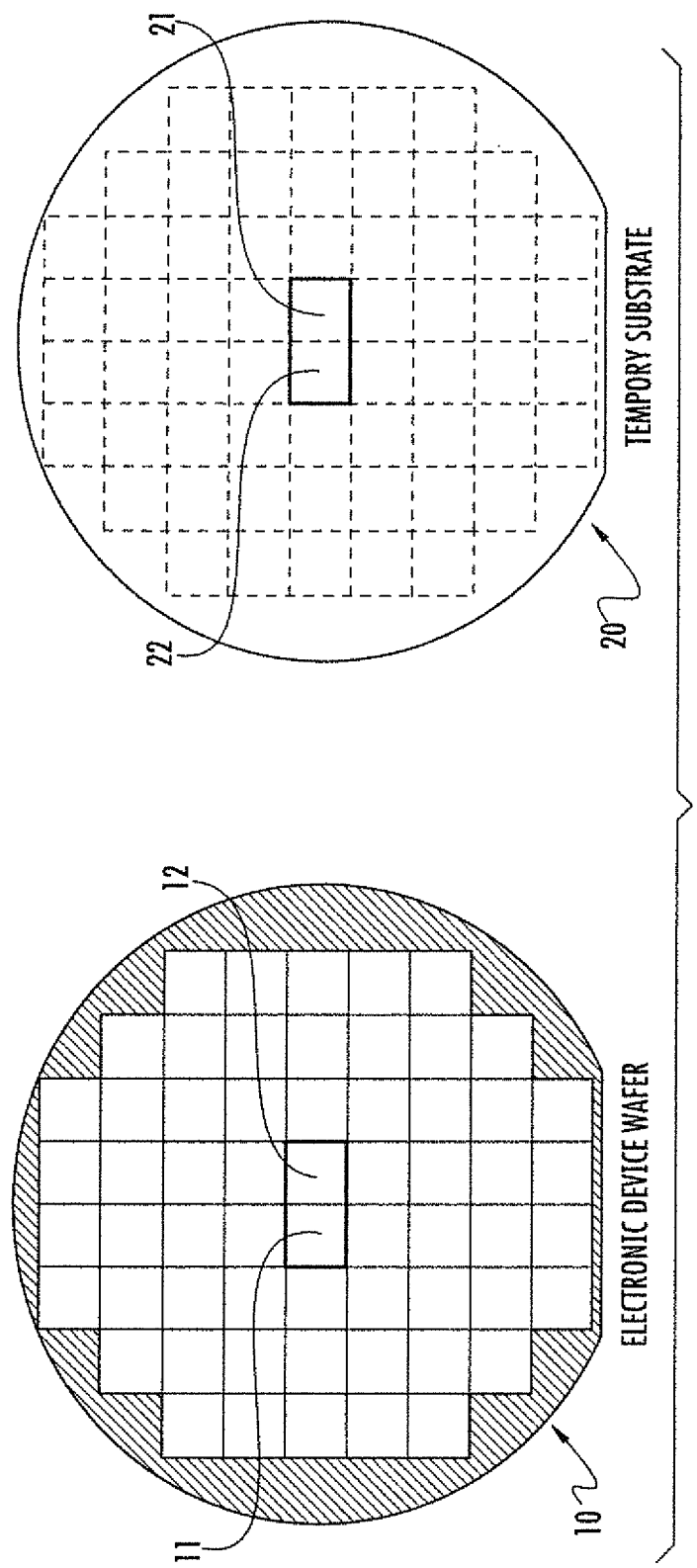

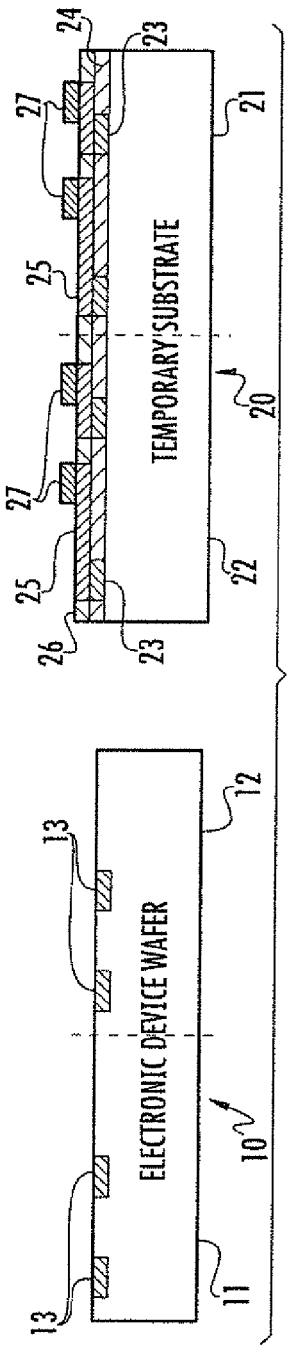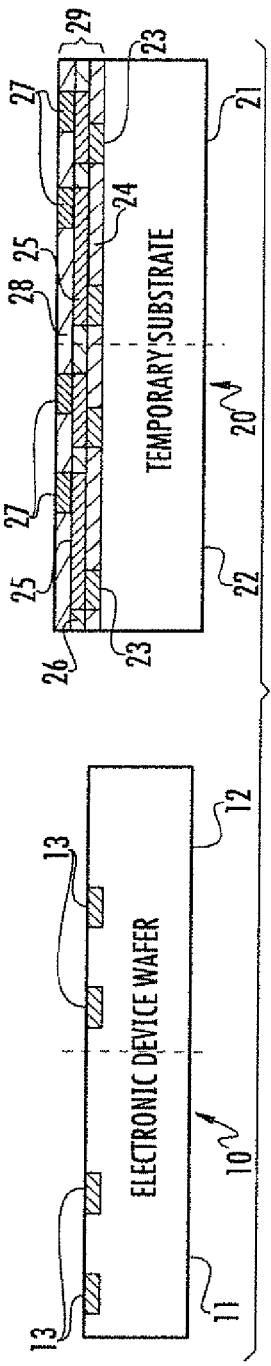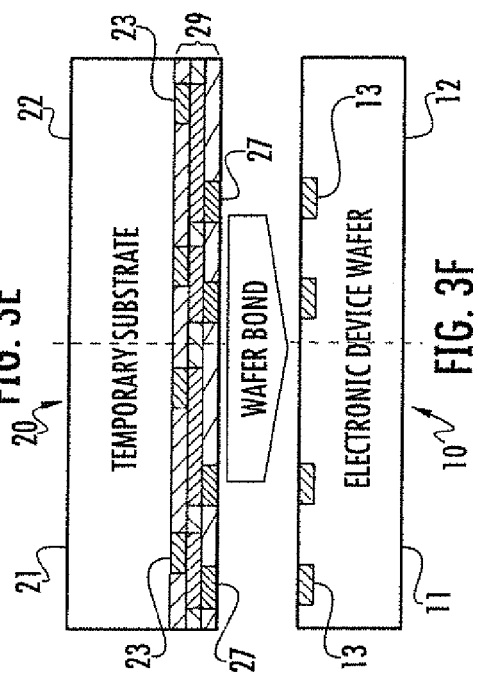

METHOD FOR MAKING A REDISTRIBUTED WAFER USING TRANSFERRABLE REDISTRIBUTION LAYERS

FIELD OF THE INVENTION

The present invention relates to the field of electronic devices and, more particularly, to methods for making electronic devices having redistribution layers (RDL).

BACKGROUND OF THE INVENTION

Conventional semiconductor device packages are typically multi-layered structures. A conventional semiconductor device package may include, for example, a bottom layer of encapsulant material, a carrier, a semiconductor die, and a top layer of encapsulant material. In addition to being located above and beneath the semiconductor die and carrier, the encapsulant material of a conventional semiconductor device package may also laterally surround the semiconductor device and the carrier. In addition, a conventional semiconductor device package typically includes input/output elements to facilitate electrical connection of the semiconductor device thereof with external electronic components.

Leads are an example of conventional input/output elements. Leads typically contribute to the dimensions of the footprint of a conventional semiconductor device package and, thus, consume an undesirably large amount of real estate upon a substrate (e.g., a circuit board) to which the semiconductor device package is to be secured and electrically connected.

Other examples of such input/output elements include pins, solder balls or other discrete conductive structures (e.g., bumps, balls, columns, etc.), which contribute to the height of a conventional semiconductor device package. When coupled with the thicknesses that conventional encapsulants and carriers impart to the overall thickness of a conventional semiconductor device package, the added heights of such discrete conductive structures may result in a semiconductor device package which will protrude an undesirably large distance from a carrier substrate to which it is secured and electrically connected.

In order to keep up with the trend toward ever-decreasing the dimensions of electronic devices, various technologies have been developed to decrease the dimensions of packaged semiconductor devices. The result of many of these technologies is the "chip-scale package" (CSP), a packaged semiconductor device with lateral dimensions that are roughly the same as (i.e., slightly larger than) the corresponding lateral dimensions of the semiconductor die thereof.

Due to the relatively small, semiconductor die-dependent, lateral dimensions of CSPs, they are often formed at the so-called "wafer-scale," meaning that packaging occurs prior to severing the semiconductor devices from a wafer or other large-scale substrate. Packaging semiconductor devices at the wafer-scale avoids the difficulties that may otherwise be associated with handling such small components during chip-scale packaging thereof.

Such wafer-scale packaging may include the formation of redistribution layers (RDL), which may rearrange or effectively expand the connection pattern of bond pads on the active surface of the semiconductor device to a redistributed connection pattern which is more suitable for connection to a substrate.

A semiconductor device including RDL is disclosed in U.S. Pat. No. 7,728,437 to Choi et al. Choi discloses a semiconductor package which includes a terminal disposed at intervals equal to or greater than a minimum pitch. The semiconductor package includes a semiconductor chip having a bottom surface on which a plurality of bumps are formed, with redistribution layer patterns formed under the semiconductor chip. Each redistribution layer includes a first part electrically connected to at least one of the bumps and a second part electrically connected to the first part. An encapsulation layer surrounds at least a top surface of the semiconductor chip, and a patterned insulating layer is formed below the redistribution layer patterns and exposes at least parts of the second parts of the redistribution layer patterns.

Further developments in methods of making electronic devices with redistribution layers are still desired, however.

SUMMARY OF THE INVENTION

In view of the foregoing background, it is therefore an object of the present invention to provide a method of transferring redistribution layers initially formed on a temporary substrate to a wafer comprising a plurality of electronic devices.

This and other objects, features, and advantages in accordance with the present invention are provided by a method of making redistributed electronic devices that includes providing a wafer comprising a plurality of electronic devices, each electronic device having a pattern of contact areas. To aid in the description of the present invention, this pattern of contact areas will be referred to as die pads.

The method includes forming redistribution layers on a temporary substrate. The redistribution layers contain a pattern of contact areas referred to as wafer bonding pads matching the die pads of the aforementioned wafer, coupled to a different pattern of contact areas referred to as redistributed pads. The die pads of the wafer of electronic devices are coupled to the wafer bonding pads of the temporary wafer containing the redistribution layers. The temporary substrate is then removed, exposing the redistributed pads.

In addition, the wafer and redistribution layers may be divided into a plurality of redistributed electronic devices after removal of the temporary substrate. Alternatively, the wafer and redistribution layers may be divided into the plurality of redistributed electronic devices before the temporary substrate is removed. After the dividing, then the temporary substrate is removed from each redistributed electronic device. A size of the temporary substrate corresponds to a size of the wafer comprising the plurality of electronic devices.

Forming the wafer and redistribution layers separately is particularly advantageous because an error in forming the wafer or redistribution layers does not result in destruction of the other, as typically occurs in prior art methods where the redistribution layers are formed directly on a wafer.

In some applications, prior to dividing the wafer, the method may include forming additional redistribution layers on an additional temporary substrate having a pattern of contact areas matching the original redistributed pads and an additional pattern of redistributed contact areas different than the original redistributed pads. The pattern of contact areas matching the original redistributed pads is coupled to the additional pattern of redistributed contact areas through the redistribution layers.

In such an application, the method may also include coupling the redistributed pads of the original redistribution layers to the pattern of contact areas matching the original redistributed pads of the additional redistribution layers and removing the additional temporary substrate from the additional redistribution layers. This may be performed multiple times in order to create the final device, which those skilled in the art will appreciate.

BRIEF DESCRIPTION OF THE DRAWINGS

FIG. 3 is a schematic view of the electronic device wafer and the temporary substrate.

FIGS. 3A-3I are schematic cross-sectional views of the redistribution layers being formed on the temporary substrate and then coupled to a wafer at the various steps of the method of the present invention.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 3A:
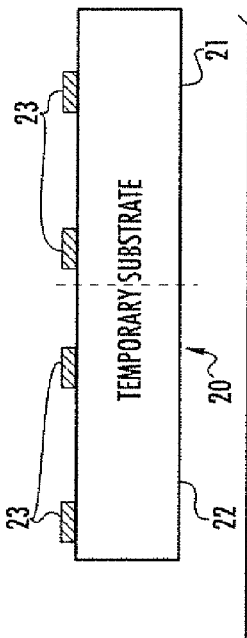
Figure 3A:
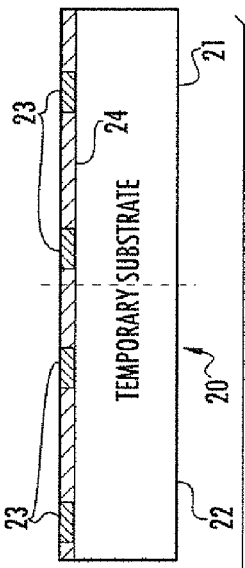
Figure 3B:
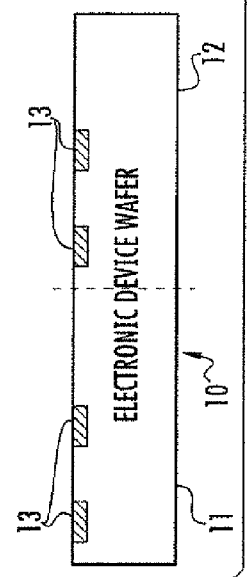
Figure 3B:
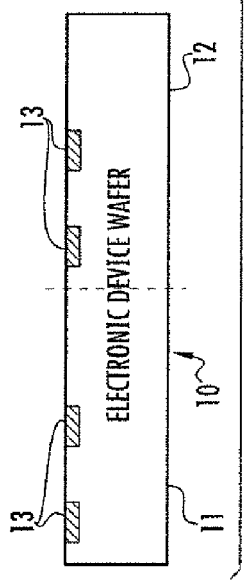
Figure 3C:
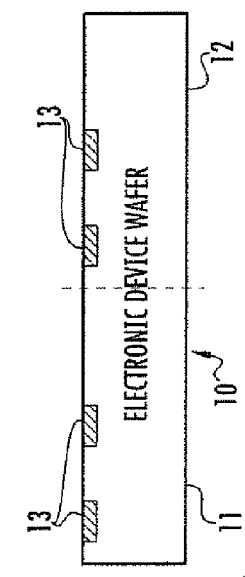

Referring initially to the flowchart 50 of FIG. 1, FIG. 3 and FIGS. 3A-3I, a method of making redistributed electronic devices 31, 32 is now described. After the start of the method (Block 51), a wafer 10 comprising a plurality of electronic devices 11, 12, with each electronic device having a pattern of contact areas forming die pads 13, is provided (Block 52) as shown in FIG. 3A. The wafer 10 may be a silicon semiconductor substrate, for example, and the electronic devices 11, 12 may be any suitable electronic devices. The die pads 13 are illustratively exposed conductive patches, but it should be understood that they may take other forms, such as pins, and may be in any pattern.

Next, the redistribution layers 29 are formed as a plurality of stacked conductive layers 23, 25, 27, with passivation layers 24, 26, 28 there between on a temporary substrate 20 (Block 56), as shown in FIGS. 3A-3E (illustrating the buildup of each conductive layer, together with the passivation layers there between). The redistribution layers 29 have a pattern of contact areas forming wafer bonding pads 27 matching the die pads 13, and a pattern of redistributed contact areas, referred to as redistributed pads 23, different than the wafer bonding pads 27. The wafer bonding pads 27 are coupled to the redistributed pads 23 via interconnecting portions 25. Those skilled in the art will appreciate that any suitable temporary substrate may be used, such as glass or silicon.

Next, optionally, the wafer 10 may be tested (Block 53). If at Block 54, the wafer 10 tests as being unsuitable for use, the method continues with providing a new wafer 10 as described above (Block 52). The new wafer 10 is then tested (Block 53), and the testing and providing a new wafer 10 continues until a good wafer is found. In other words, yield of good die on the wafer is greater than a threshold.

If at Block 54 the wafer tests as being suitable for use, the method proceeds to processing the redistribution layers on the temporary substrate 20, and then the redistribution layers 29 may optionally be tested (Block 57). If the redistribution layers 29 are unsuitable for use at Block 58, the method continues with forming new redistribution layers 29 on a new temporary substrate 20, as described above (Block 56).

These testing steps are particularly useful and represent an important advantage of the present invention over prior art methods. By forming the wafer 10 and redistribution layers 29 separately, as opposed to forming the redistribution layers directly on the wafer as in the prior art, the wafer and redistribution layers may be tested prior to their coupling. This way, if the wafer 10 or redistribution layers 29 are bad, non-functional, or unsuitable for use, can be replaced without having wasted the corresponding redistribution layers or wafer. In addition, forming the wafer 10 and redistribution layers 29 separately means that the wafer is not subjected to the thermal stresses caused by forming the redistribution layers directly on the wafer.

If the redistribution layers 29 are suitable for use at Block 58, the method continues with coupling the die pads 13 to the wafer bonding pads 27 (Block 60), as shown in FIG. 3F. This coupling is achieved through a wafer to wafer bonding process, as will be appreciated by those skilled in the art.

Figure 3G:
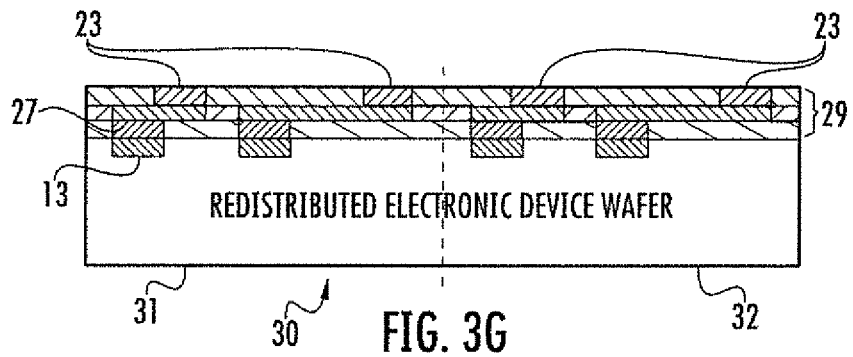

Next, the method continues with the removal of the temporary substrate 20 (Block 61), as shown in FIG. 3G. Removal of the temporary substrate may be performed through the use of chemical or mechanical processes, as will be appreciated by those skilled in the art.

Figure 1:
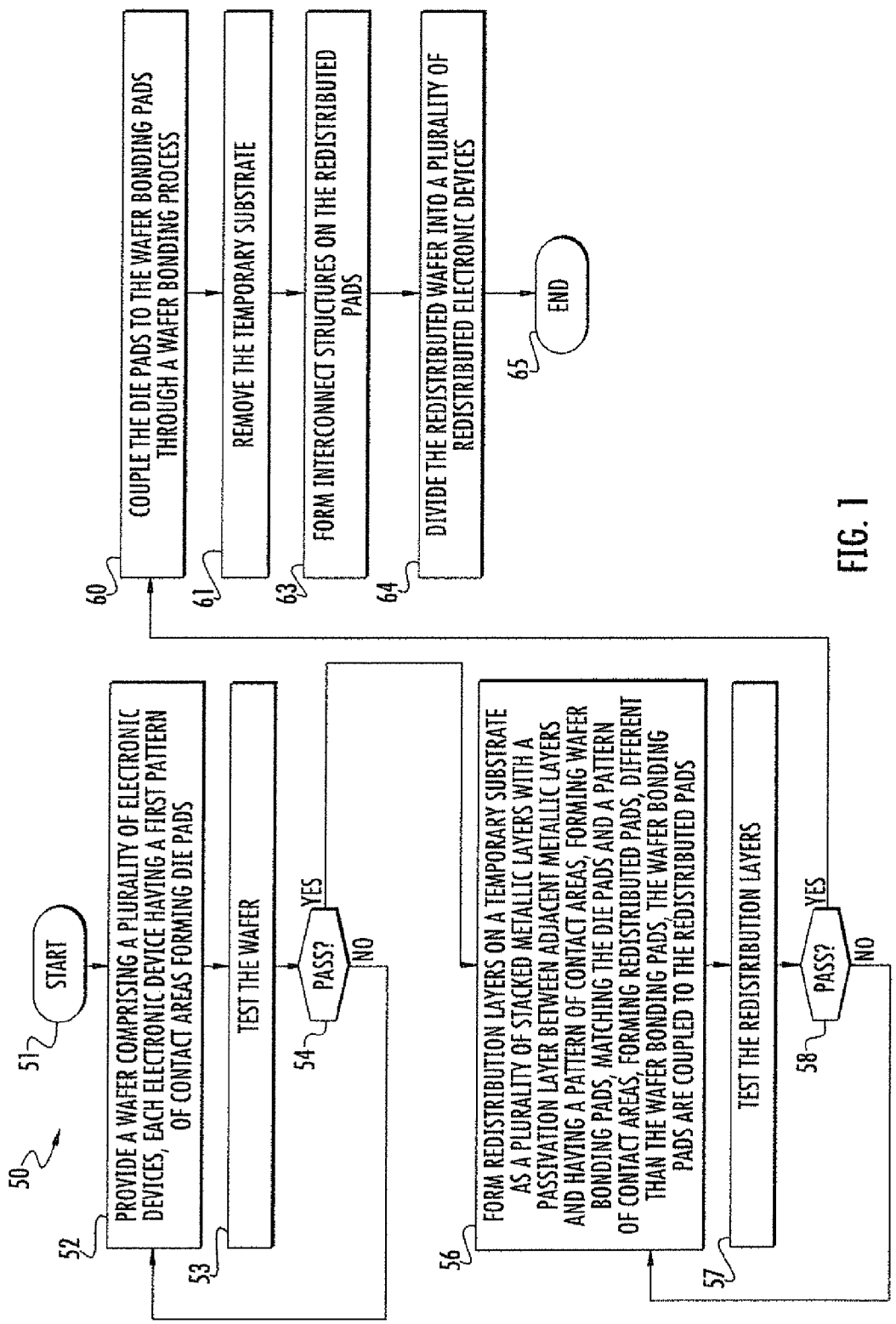
FIG. 1 is a flowchart of a method of coupling redistribution layers to a wafer in accordance with the present invention.
Figure 2:
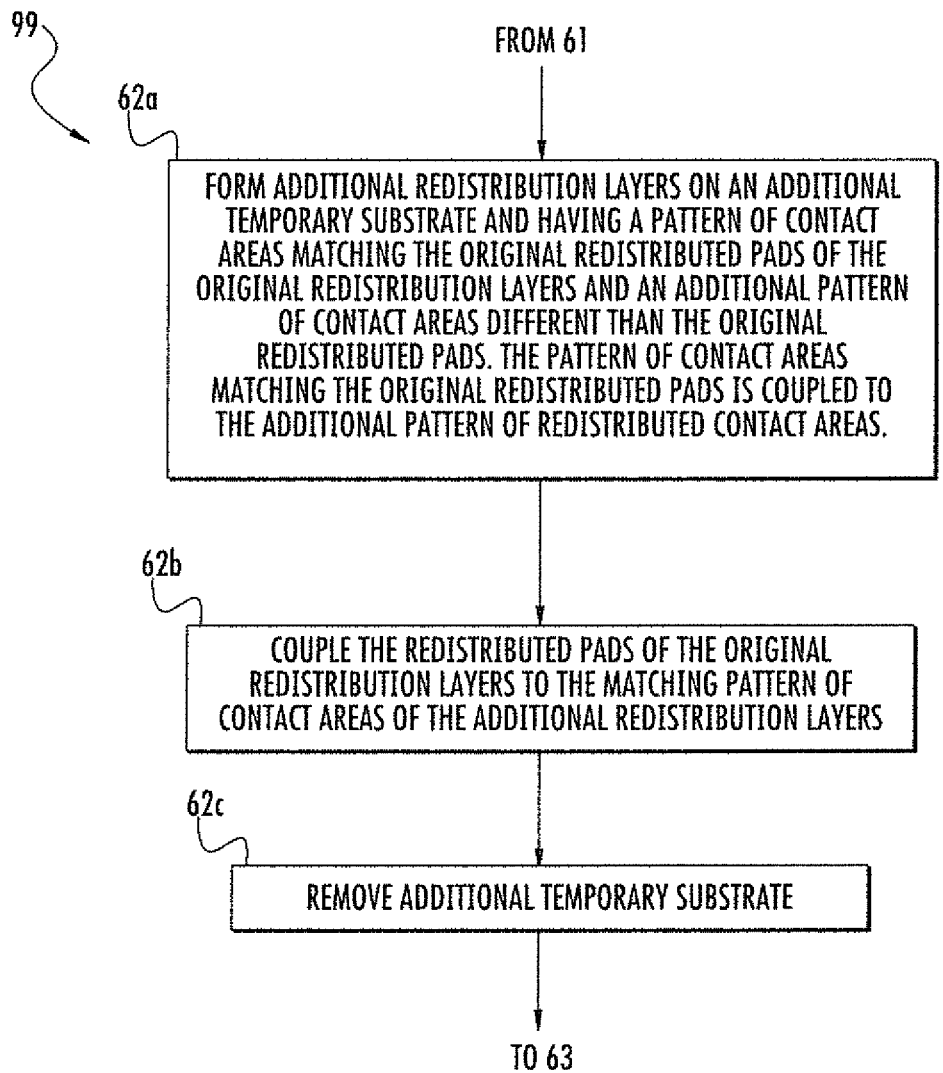
FIG. 2 is a flowchart indicating optional steps in the method of coupling additional redistribution layers to the wafer in accordance with the present invention.

Optionally, additional redistribution layers may be formed on additional temporary substrates using the methods described above. As shown in the flowchart 99 of FIG. 2, forming additional redistribution layers on an additional temporary substrate having a pattern of contact areas matching the original redistributed pads and an additional pattern of redistributed contact areas different than the original redistributed pads (Block 62a). The pattern of contact areas matching the original redistributed pads is coupled to the additional pattern of redistributed contact areas through the redistribution layers. In such an application, the method may also include coupling the redistributed pads of the original redistribution layers to the matching pattern of contact areas of the additional redistribution layers (Block 62b). Thereafter, the additional temporary substrate is removed (Block 62c).

Forming these additional redistribution layers may be useful when the materials used to form the additional redistribution layers and original redistribution layers 29 are different and different processing temperatures are used. In these situations, forming the additional redistribution layers separately is more advantageous than making the original redistribution layers 29 more complicated.

Figure 3H:
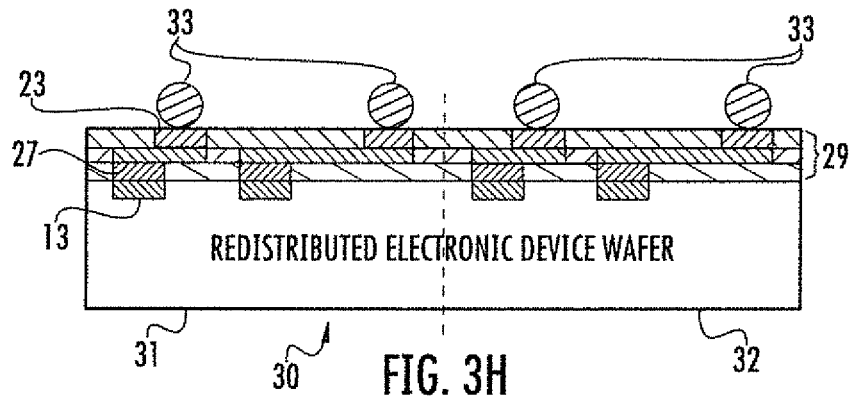

Referring to FIG. 3H, interconnect structures 33 are then formed on the exposed pattern of redistributed contact areas 23 (Block 63). The interconnect structures 33 are input/output elements that include pins, solder balls or other discrete conductive structures (e.g., bumps, balls, columns, etc.).

Figure 3I:
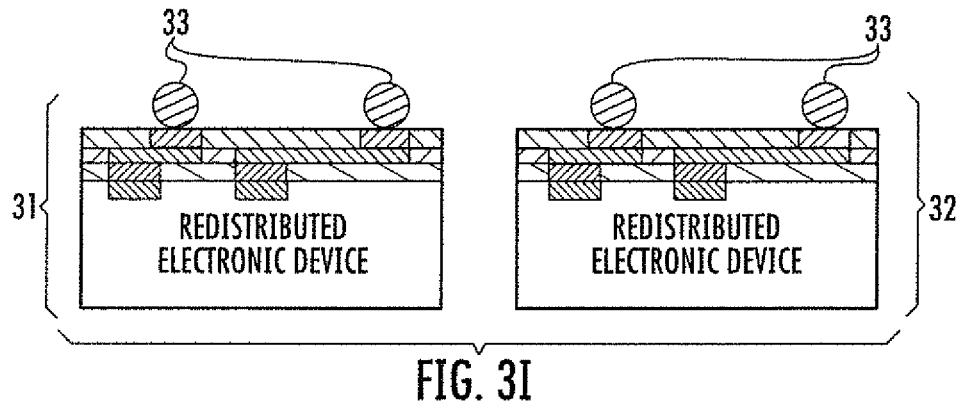

The wafer 10 and redistribution layers 29 are then divided into a plurality of redistributed electronic devices 31, 32 (Block 64) using techniques known to those of skill in the art, as shown in FIG. 3I.

Even though the illustrated flowchart shows Block 64 being performed after Block 61, the reverse order may occur. That is, the coupled wafers and redistribution layers may be divided into a plurality of redistributed electronic device before the temporary substrates are removed from the redistribution layers. The temporary substrate can then be removed for each individual redistributed electronic device. Even though the order of Blocks 61 and 64 are interchangeable, forming the interconnect structures on the redistributed pads in Block 63 needs to be performed after the temporary substrate has been removed in Block 61. This is regardless of when the redistributed wafer is divided in Block 64. For instance, processing in the order of Blocks 61, 64, 63 would be acceptable. Block 65 indicates the end of the method.

As discussed above, a wafer 10 comprising the electronic devices 11, 12 is coupled to the redistribution layers 29 on the temporary substrate 20. A size of the temporary substrate 20 corresponds to a size of the wafer 10 comprising the plurality of electronic devices 11, 12. This may be referred to as redistribution at the wafer level. After being coupled together, the wafer 10 and the temporary substrate 20 are then divided into redistributed electronic devices 31, 32. The dividing may be done before or after the temporary substrate 20 is removed. Since the electronic devices 11, 12 come from the same wafer 10, they typically have the same design, function and layout. In other words, the electronic devices 11 and 12 on the wafer 10 are equal to one another.

Figure 4:
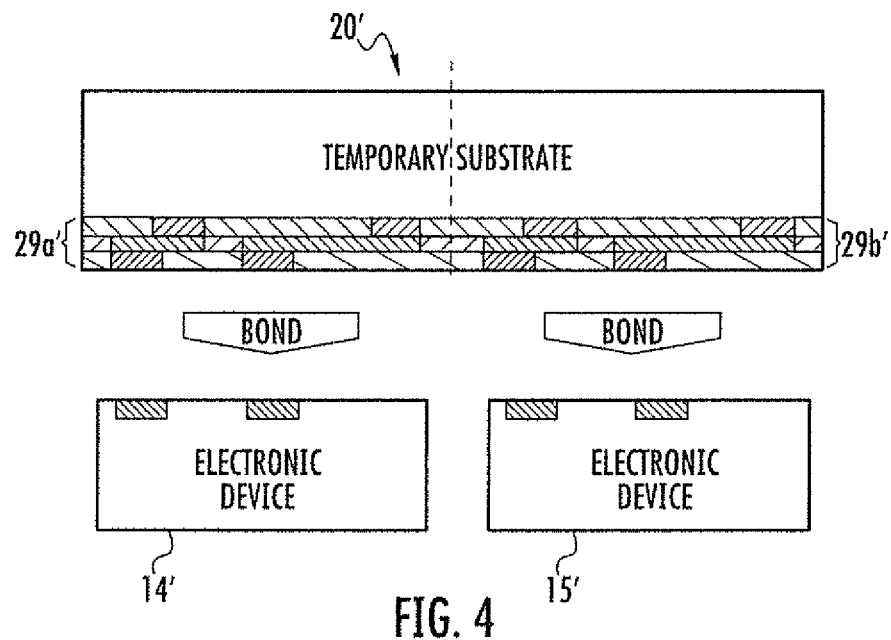
FIG. 4 is a schematic cross-sectional view of separated electronic devices being bonded to the temporary substrate in accordance with the present invention.
Figure 5:
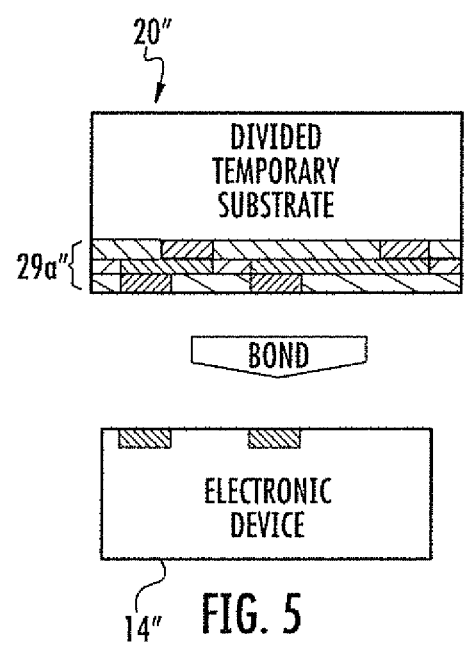
FIG. 5 is a schematic cross-sectional view of a separated electronic device being bonded to a separated temporary substrate in accordance with the present invention.
Figure 6:
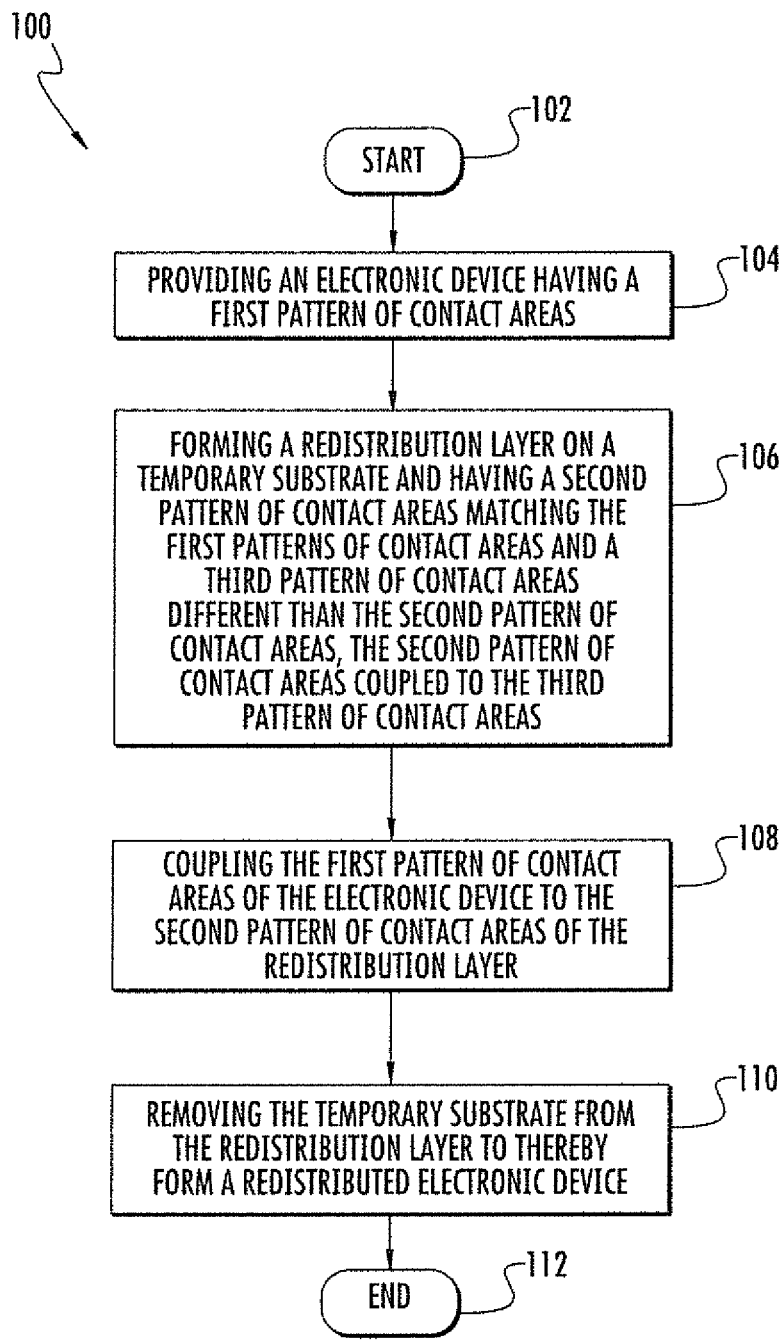
FIG. 6 is a flowchart of a method of coupling a redistribution layer to a separated electronic device in accordance with the present invention.

Referring now to FIGS. 4-6, another aspect is directed to making single electronic devices 14', 15' with a respective redistribution layer 29a', 29b' thereon. In contrast to above, this aspect may be referred to as redistribution at the electronic device level since the electronic devices are separated from their respective electronic device wafers before being coupled to their respective redistribution layers 29a', 29b'.

Since the electronic devices 14', 15' are each being handled on an individual basis, they may be different from one another in terms of design and function. This allows the electronic devices 14', 15' to be random from one another. Electronic devices as used herein broadly covers integrated circuits, dies and any components requiring a redistribution layer, as readily appreciated by those skilled in the art.

As illustrated in FIG. 4, the temporary substrate 20' is sized so that more than one electronic device 14', 15' may be bonded to a respective redistribution layer thereon. For example, electronic device 14' is bonded to redistribution layer 29a', and electronic device 15' is bonded to redistribution layer 29b'.

The temporary substrate 20' is formed with the redistribution layers 29a', 29b' being different from one another. The above description with respect to forming the redistribution layers 29 on a temporary substrate 20 is also applicable to forming the redistribution layers 29a', 29b' on a temporary substrate 20', with the exception being that the pattern of contact areas on the redistribution layers 29a', 29b' are different from one another.

Alternatively, the temporary substrate may be formed so that the redistribution layers are all the same, as is the case for the temporary substrate 20 illustrated in FIG. 3. This means that the individual electronic devices 11, 12 are also all the same so that they match up with the redistribution layers 29 on the temporary substrate 20.

Another aspect is directed to the temporary substrate 20" being sized so that it corresponds in size to an electronic device 14" being bonded thereto, as illustrate in FIG. 5. The temporary substrate 20" as illustrated may originate as a divided or cut temporary substrate that initially had more than one redistribution layer thereon. For example, the temporary substrate 20' with redistribution layers 29a', 29b' as illustrated in FIG. 4 has been divided so the reconfigured temporary substrate 20" has redistribution layer 29a" thereon.

In terms of removing the temporary substrate 20' illustrated in FIG. 4 from the electronic devices 14', 15', this may be done after the electronic devices have been cut or separated into individual redistributed electronic devices. Alternatively, the temporary substrate 20' may be removed before the electronic devices 14', 15' or cut or separated into individual redistributed electronic devices.

In terms of removing the temporary substrate 20" illustrated in FIG. 5 from the electronic devices 14", this is done after the electronic device has been bonded to the individual redistributed layer 29a". This process is repeated for the other individual electronic devices and their respective individual redistribution layer.

A flowchart 100 illustrating a method for making an electronic device with a redistribution layer will now be discussed in reference to FIG. 6. From the start (Block 102), an electronic device having a first pattern of contact areas is formed at Block 104. The method comprises forming a redistribution layer at Block 106 on a temporary substrate. The temporary substrate has a second pattern of contact areas matching the first pattern of contact areas, and a third pattern of contact areas different than the second pattern of contact areas. The second pattern of contact areas is coupled to the third pattern of contact areas. The first pattern of contact areas of the electronic device is coupled to the second pattern of contact areas of the redistribution layer at Block 108. The temporary substrate is removed from the redistribution layer at Block 110 to thereby form a redistributed electronic device. The method ends at Block 112.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method of making electronic devices with redistribution layers comprising:
   providing a wafer comprising a plurality of electronic devices, each electronic device having a pattern of contact areas forming die pads;
   forming redistribution layers on a temporary substrate and comprising a first layer having a pattern of contact areas forming wafer bonding pads matching the die pads, a third layer having a pattern of contact areas forming redistributed pads different than the wafer bonding pads, and a second layer having a pattern of interconnecting portions coupling the wafer bonding pads to the redistributed pads, with each interconnecting portion having a first contact area pattern and a second contact area pattern coupled thereto so that the first and second contact area patterns are laterally offset from one another;
   coupling the die pads of the wafer to the wafer bonding pads of the redistribution layers;
   removing the temporary substrate from the redistribution layers; and
   dividing the coupled wafer and redistribution layers into a plurality of redistributed electronic devices.

2. The method of claim 1, wherein the dividing is performed before removing the temporary substrate.

3. The method of claim 1, wherein a size of the temporary substrate corresponds to a size of the wafer comprising the plurality of electronic devices.

4. The method of claim 1, wherein forming the redistribution layers comprises forming a plurality of stacked conductive layers.

5. The method of claim 4, wherein the method further comprises forming a passivation layer between adjacent conductive layers.

6. The method of claim 1, further comprising, prior to dividing the coupled wafer and redistribution layers, forming interconnect structures on the redistributed pads.

7. The method of claim 1, further comprising, prior to dividing the coupled wafer and redistribution layers:
forming additional redistribution layers on an additional temporary substrate having a first pattern of contact areas matching the redistributed pads and a second pattern of contact areas different than the first pattern of contact areas, the first pattern of contact areas being coupled to the second pattern of contact areas;
coupling the redistributed pads of the redistribution layers to the first pattern of contact areas of the additional redistribution layers;
removing the additional temporary substrate from the additional redistribution layers.

8. The method of claim 1, wherein the method further comprises testing the provided wafer comprising a plurality of electronic devices prior to coupling the die pads to the wafer bonding pads.

9. The method of claim 1, wherein the method further comprises testing the redistribution layers prior to coupling the die pads to the wafer bonding pads.

10. The method of claim 1, wherein the temporary substrate comprises glass.

11. A method of making electronic devices with redistribution layers comprising:
providing a wafer comprising a plurality of electronic devices, each electronic device having a pattern of contact areas forming die pads;
forming redistribution layers on a temporary substrate and comprising a first layer having a pattern of contact areas forming wafer bonding pads matching the die pads, a third layer having a pattern of contact areas forming redistributed pads different than the wafer bonding pads, and a second layer having a pattern of interconnecting portions coupling the wafer bonding pads to the redistributed pads, with each interconnecting portion having a first contact area pattern and a second contact area pattern coupled thereto so that the first and second contact area patterns are laterally offset from one another;
testing the provided wafer comprising a plurality of electronic devices;
coupling the die pads of the wafer to the wafer bonding pads on the redistribution layers;
removing the temporary substrate from the redistribution layers;
forming interconnect structures on the redistributed pads on the redistribution layers; and
dividing the coupled wafer and redistribution layers into a plurality of redistributed electronic devices.

12. The method of claim 11, wherein the dividing is performed before removing the temporary substrate.

13. The method of claim 11, wherein a size of the temporary substrate corresponds to a size of the wafer comprising the plurality of electronic devices.

14. The method of claim 11, wherein forming the redistribution layers comprises forming a plurality of stacked conductive layers.

15. The method of claim 14, further comprising forming a passivation layer between adjacent conductive layers.

16. The method of claim 11, further comprising, prior to dividing the coupled wafer and redistribution layers:
forming additional redistribution layers on an additional temporary substrate having a first pattern of contact areas matching the redistributed pads and a second pattern of contact areas different than the first pattern of contact areas, the first pattern of contact areas being coupled to the second pattern of contact areas;
coupling the redistributed pads of the redistribution layers to the first pattern of contact areas of the additional redistribution layers;
removing the additional temporary substrate from the additional redistribution layers.

17. The method of claim 11, wherein the temporary substrate comprises glass.

18. A method of making electronic devices with redistribution layers comprising:
providing a wafer comprising a plurality of electronic devices, each electronic device having a pattern of contact areas forming die pads;
forming redistribution layers on a temporary substrate and comprising a first layer having a pattern of contact areas forming wafer bonding pads matching the die pads, a third layer having a pattern of contact areas forming redistributed pads different than the wafer bonding pads, and a second layer having a pattern of interconnecting portions coupling the wafer bonding pads to the redistributed pads, with each interconnecting portion having a first contact area pattern and a second contact area pattern coupled thereto so that the first and second contact area patterns are laterally offset from one another;
testing the redistribution layers;
coupling the die pads to the wafer bonding pads;
removing the temporary substrate;
forming interconnect structures on the redistributed pads of the redistribution layers, and
dividing the coupled wafer and redistribution layers into a plurality of redistributed electronic.

19. The method of claim 18, wherein the dividing is performed before removing the temporary substrate.

20. The method of claim 18, wherein a size of the temporary substrate corresponds to a size of the wafer comprising the plurality of electronic devices.

21. The method of claim 18, wherein forming the redistribution layers comprises forming a plurality of stacked conductive layers.

22. The method of claim 21, further comprising forming a passivation layer between adjacent conductive layers.

23. The method of claim 18, further comprising, prior to dividing the coupled wafer and redistribution layers:
forming additional redistribution layers on an additional temporary substrate having a first pattern of contact areas matching the redistributed pads and a second pattern contact areas different than the first pattern of contact areas, the first pattern of contact areas being coupled to the second pattern of contact areas;
coupling the redistributed pads of the redistribution layers to the first pattern of contact areas of the additional redistribution layers;
removing the additional temporary substrate from the additional redistribution layers.

24. The method of claim 18, wherein the temporary substrate comprises glass.

\* \* \* \* \*